(12) United States Patent
Buschendorf et al.

(10) Patent No.: US 9,936,610 B2
(45) Date of Patent: Apr. 3, 2018

(54) MULTILEVEL CONVERTER

(71) Applicant: SIEMENS AKTIENGESELLSCHAFT, Munich (DE)

(72) Inventors: Martin Buschendorf, Dresden (DE); Ingo Euler, Erlangen (DE); Martin Pieschel, Nuremberg (DE); Andreas Zenkner, Obermichelbach (DE)

(73) Assignee: Siemens Aktiengesellschaft, Munich (DE)

( * ) Notice: Subject to any disclaimer, the term of this patent is extended or adjusted under 35 U.S.C. 154(b) by 24 days.

(21) Appl. No.: 14/903,514

(22) PCT Filed: Jul. 8, 2013

(86) PCT No.: PCT/EP2013/064379
§ 371 (c)(1),
(2) Date: Jan. 7, 2016

(87) PCT Pub. No.: WO2015/003734
PCT Pub. Date: Jan. 15, 2015

(65) Prior Publication Data
US 2016/0165759 A1    Jun. 9, 2016

(51) Int. Cl.
*H05K 7/20* (2006.01)
*H02M 7/00* (2006.01)
*H02M 7/483* (2007.01)

(52) U.S. Cl.
CPC ........ *H05K 7/20409* (2013.01); *H02M 7/003* (2013.01); *H05K 7/20436* (2013.01); *H02M 2007/4835* (2013.01)

(58) Field of Classification Search
CPC .. H05K 7/20409; H05K 7/209; H05K 7/2039; H05K 7/1405; H05K 1/0201–1/0204; H02M 7/003
(Continued)

(56) References Cited

U.S. PATENT DOCUMENTS 5,164,624 A * 11/1992 Desai .................... H01L 25/112
257/712
6,031,279 A    2/2000 Lenz
(Continued)

FOREIGN PATENT DOCUMENTS

CN    101777849 A    7/2010
DE    19635582 C1    2/1998
(Continued)

OTHER PUBLICATIONS

Lesnicar, A., et al., "An innovative modular multilevel converter topology suitable for a wide power range," Power Tech Conference Proceedings, 2003 IEEE Bologna , Jun. 23-26, 2003, pp. 6, vol. 3.

*Primary Examiner* — Dion R Ferguson
*Assistant Examiner* — Amir Jalali
(74) *Attorney, Agent, or Firm* — Laurence Greenberg; Werner Stemer; Ralph Locher (57) ABSTRACT

A multilevel converter contains at least two submodules which are connected in a row. Each of the submodules contains at least two switches and a capacitor and two current-carrying outer module terminals. Accordingly, at least one of the submodules has at least one outer cooling member which acts as a current-carrying outer module terminal.

13 Claims, 11 Drawing Sheets

(58) Field of Classification Search
USPC .......... 361/704, 709–712, 715–716; 363/141
See application file for complete search history.

(56) References Cited

U.S. PATENT DOCUMENTS

| | | | |
|---|---|---|---|
| 6,501,172 | B1 | 12/2002 | Fukada et al. |
| 9,006,784 | B2* | 4/2015 | Okumura ............ H01L 23/3672 257/177 |
| 9,685,883 | B2* | 6/2017 | Huang .................. H02M 7/219 |
| 9,723,741 | B2* | 8/2017 | Dilley .................... H05K 7/026 |
| 2001/0033477 | A1 | 10/2001 | Inoue et al. |
| 2002/0186545 | A1 | 12/2002 | Fukada et al. |
| 2006/0007721 | A1* | 1/2006 | Rodriguez ............ H02M 7/003 363/146 |
| 2007/0000231 | A1 | 1/2007 | Otsuka et al. |
| 2007/0181908 | A1 | 8/2007 | Otremba |
| 2010/0066174 | A1* | 3/2010 | Dommaschk ........... H02M 1/32 307/75 |
| 2010/0188813 | A1 | 7/2010 | Nakatsu et al. |
| 2010/0277958 | A1* | 11/2010 | Campbell .............. B60K 6/485 363/40 |
| 2013/0003305 | A1 | 1/2013 | Stella |
| 2015/0131232 | A1* | 5/2015 | Ishino ................. H01L 23/4334 361/707 |
| 2016/0315037 | A1* | 10/2016 | Kadoguchi ....... H01L 23/49562 |

FOREIGN PATENT DOCUMENTS

| | | |
|---|---|---|
| EP | 2369624 A1 | 9/2011 |
| EP | 2600510 A1 | 6/2013 |
| JP | 2001332679 A | 11/2001 |
| JP | 2002198477 A | 7/2002 |
| JP | 2010016402 A | 1/2010 |
| RU | 2299496 C2 | 5/2007 |
| WO | 2013000512 A1 | 1/2013 |

* cited by examiner

MULTILEVEL CONVERTER

BACKGROUND OF THE INVENTION

Field of the Invention

The invention relates to a multilevel converter comprising at least two submodules connected in series, wherein each submodule has in each case at least two switches and a capacitor and two current-carrying external module terminals.

Such a multilevel converter is known for example from the document "An Innovative Modular Multilevel Converter Topology Suitable for Wide Power Range" (A. Lesnicar and R. Marquardt, 2003 IEEE Bologna Power Tech Conference, Jun. 23-26, 2003, Bologna, Italy). This previously known multilevel converter is a so-called Marquardt converter arrangement comprising at least two series circuits connected in parallel. Each of the series circuits connected in parallel comprises in each case at least two series-connected submodules comprising in each case at least two switches and a capacitor. The voltage level at the output of the multilevel converter can be set in a targeted manner by means of a suitable driving of the switches.

In the case of modular multilevel converters, the individual submodules at the present time are arranged in a manner electrically insulated from one another. On account of the electrical insulation, the current forces that occur during the operation of the submodules can bring about considerable mechanical vibrations which can subject the submodules as such, and the components connected thereto, to considerable mechanical loading and lead to premature ageing. In order to gain control of the problem of the vibrations that occur, nowadays additional mechanical damping devices are used in multilevel converters; however, said damping devices lead to considerable additional weight and can impair the insulation strength, under certain circumstances. Accordingly, the invention is based on the object of specifying a multilevel converter for which the vibration problem described is solved better than heretofore.

BRIEF SUMMARY OF THE INVENTION

This object is achieved according to the invention by means of a multilevel converter having the features of the main patent claim. Advantageous configurations of the multilevel converter according to the invention are specified in dependent claims.

The invention accordingly provides for at least one submodule to have at least one outer heat sink that serves as a current-carrying external module terminal.

One major advantage of the submodule according to the invention can be seen in the fact that at least one heat sink that serves for cooling components of the submodule simultaneously also performs the function of a current-carrying external module terminal. This makes it possible, for example, for submodules to be contacted with one another by the heat sinks of adjacent submodules being placed onto one another and connected to one another. Placing submodules onto one another via the heat sinks and simultaneously utilizing the heat sinks as external current-carrying module terminals makes it possible, in turn, to fix the submodules in a manner free of vibrations or at least with few vibrations, such that the risk of excessively great mechanical vibrations is reduced during the operation of the submodules or during the operation of the multilevel converter.

In accordance with one particularly preferred configuration of the multilevel converter, it is provided that the outer heat sink forms an outer wall of the submodule, and on the inner side of the heat sink at least one of the switches of the respective submodule is mounted for cooling purposes and is electrically connected by a switch terminal to the heat sink.

It is regarded as particularly advantageous if at least two adjacent submodules have in each case at least one heat sink which forms one of the current-carrying external module terminals of the respective submodule and on which at least one of the switches of the respective submodule is mounted on the inner wall side for cooling purposes, and the heat sinks of the at least two adjacent submodules bear against one another on the outer wall side in such a way that the heat sinks thereof and thus the current-carrying external module terminals formed by said heat sinks are electrically connected to one another.

The submodules can have in each case two heat sinks, for example. In such a way, it is regarded as advantageous if at least two submodules have in each case a first and a second outer heat sink, of which the first heat sink serves as a first current-carrying external module terminal and the second heat sink serves as a second current-carrying external module terminal of the respective submodule and the first current-carrying external module terminal of one of the at least two submodules is electrically connected to the second current-carrying external module terminal of another of the at least two submodules, specifically by mechanical contact between the first heat sink of said one of the at least two submodules and the second heat sink of the other of the at least two submodules.

The switches of the submodules can electrically form so-called H-bridges, for example. Accordingly, it is regarded as advantageous if at least one of the submodules has a first series circuit, a second series circuit and a capacitor connected in parallel with the two series circuits, wherein the first series circuit and the second series circuit comprise in each case two switches electrically connected in series, the first series circuit is fitted to a first heat sink of the submodule and the second series circuit is fitted to a second heat sink of the submodule, a center terminal of the first series circuit is electrically connected to the first heat sink and forms the first current-carrying module terminal of the submodule, and a center terminal of the second series circuit is electrically connected to the second heat sink and forms the second current-carrying module terminal of the submodule.

It is particularly advantageous if two or more submodules have in each case a first series circuit and a second series circuit having in each case two series-connected switches and in each case a capacitor connected in parallel with the two series circuits, the first series circuit is fitted to a first heat sink of the respective submodule and the second series circuit is fitted to a second heat sink of the respective submodule, a center terminal of the first series circuit is in each case electrically connected to the first heat sink of the respective submodule and forms the first current-carrying module terminal of the respective submodule, a center connection of the second series circuit is in each case electrically connected to the second heat sink of the respective submodule and forms the second current-carrying module terminal of the respective submodule, the submodules bear against one another in pairs in such a way that the first heat sink of one of the submodules bears against the second heat sink of an adjacent submodule and is thermally and electrically conductively connected thereto.

Instead of electrical H-bridges, the transistors of the submodules can electrically also form so-called half-bridges. Accordingly, in accordance with another configuration it is regarded as advantageous if at least one of the submodules is a half-bridge module having a first switch and a second switch, wherein the second switch is electrically connected in series with the capacitor of the half-bridge module and the first switch is connected in parallel with this series circuit, and one of the two switch terminals of the first switch is connected to the heat sink or one of the heat sinks of the half-bridge module and forms one of the two current-carrying external module terminals of the half-bridge module.

In the case of H-bridge submodules, it is particularly advantageous if the multilevel converter has at least two half-bridge modules, the first switch of the at least two half-bridge modules is connected to a first heat sink of the respective half-bridge module and the second switch of the at least two half-bridge modules is connected to a second heat sink of the respective half-bridge module, one of the two switch terminals of the first switch of the at least two half-bridge modules is electrically connected to the first heat sink of the respective half-bridge module and forms the first current-carrying module terminal of the respective half-bridge module, the other of the two switch terminals of the first switch of the at least two half-bridge modules is electrically connected to the second heat sink of the respective half-bridge module and forms the second current-carrying module terminal of the respective half-bridge module, and the at least two half-bridge modules bear against one another in pairs in such a way that the first heat sink of one of the at least two half-bridge modules bears against the second heat sink of another of the at least two half-bridge modules and is electrically connected thereto.

With regard to placing submodules onto one another in a simple manner, it is regarded as advantageous if the first and second heat sinks of at least two submodules are arranged parallel to one another and form current-carrying external module terminal plates, and the at least two switches of the respective submodule lie spatially in the region between the two module terminal plates of the respective submodule.

With regard to a fixed connection of adjacent submodules, it is advantageous if a clamping device is present, which presses the first heat sink of at least one of the submodules onto a second heat sink of an adjacent submodule.

If a submodule has only one heat sink, then another current-carrying external module terminal of the submodule can be formed by an electrode plate. Accordingly, it is regarded as advantageous if at least one of the submodules has a heat sink on which the switches of the respective switching module are mounted, and the heat sink forms a first current-carrying external module terminal of the submodule, and the submodule has an electrode plate that is arranged at a distance from the heat sink of the submodule and forms a second current-carrying external module terminal of the submodule.

By way of example, it can be provided that at least two submodules have in each case a heat sink on which the switches of the respective switching module are mounted, and the heat sink forms a first current-carrying external module terminal of the respective submodule, the at least two submodules have in each case an electrode plate that is arranged at a distance from the heat sink of the respective submodule and forms a second current-carrying external module terminal of the respective submodule, and the first current-carrying external module terminal of one of the at least two submodules is electrically connected to the second current-carrying external module terminal of another of the at least two submodules, specifically by a mechanical contact between the heat sink of said one of the at least two submodules and the electrode plate of the other of the at least two submodules.

It is advantageous if the heat sink and the electrode plate in the at least two submodules are arranged in each case parallel to one another and form current-carrying external module terminal plates of the respective submodule, and the at least two switches of each of the at least two submodules in each case lie spatially in the region between the two current-carrying external module terminal plates.

Preferably, a clamping device is present, which presses the heat sink of at least one of the submodules onto an electrode plate of an adjacent submodule.

The invention furthermore relates to a submodule for a multilevel converter such as has been described above.

With regard to such a submodule, the invention provides for at least one outer heat sink of the submodule to serve as a current-carrying external module terminal.

With regard to the advantages of the submodule according to the invention, reference should be made to the above explanations in connection with the multilevel converter according to the invention, since the advantages of the multilevel converter substantially correspond to those of the submodule.

BRIEF DESCRIPTION OF THE SEVERAL VIEWS OF THE DRAWING

The invention is explained in greater detail below on the basis of exemplary embodiments; in the figures, by way of example.

DESCRIPTION OF THE INVENTION

In the figures, the same reference signs are always used for identical or comparable components, for the sake of clarity.

Figure 1:
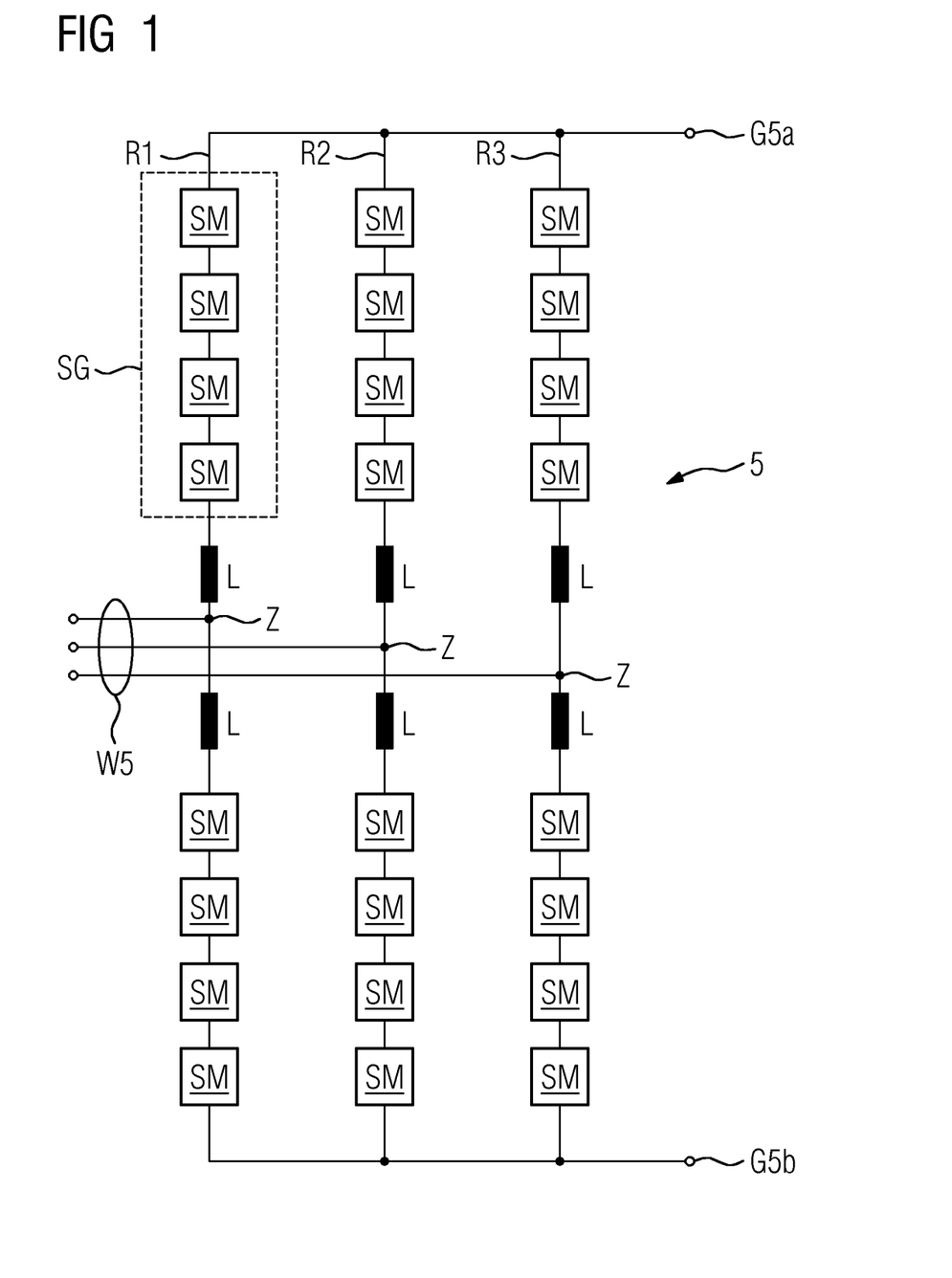
FIG. 1 shows one exemplary embodiment of a three-phase multilevel converter equipped with a multiplicity of submodules.

FIG. 1 shows one exemplary embodiment of a three-phase multilevel converter 5. The latter comprises AC voltage terminals W5 for feeding AC current in or out and two DC voltage terminals G5a and G5b, at which a DC current or a temporally variable DC current is fed in or drawn. The direction of the energy flow and the temporal profile of the output voltage, whether at the AC voltage terminals W5 or the DC voltage terminals G5a and G5b, depend on the driving of submodules SM that are connected in series in series circuits R1, R2 and R3. Such driving can be performed by a central control device, which is not shown in FIG. 1 for the sake of clarity.

In the exemplary embodiment in accordance with FIG. 1, each of the three series circuits R1, R2 and R3 is equipped in each case with eight series-connected submodules SM and two inductances L. An intermediate terminal Z is situated in each case between the two inductances L, said intermediate terminal, in terms of potential, lying between the upper four submodules in FIG. 1 and the lower four submodules in FIG. 1 and forming one of the three AC voltage terminals W5 of the 25 multilevel converter 5.

In the multilevel converter 5 in accordance with FIG. 1, in each case four submodules respectively form a submodule group SG in which the submodules SM bear mechanically against one another and are preferably pressed onto one another by means of a clamping device.

Figure 2:
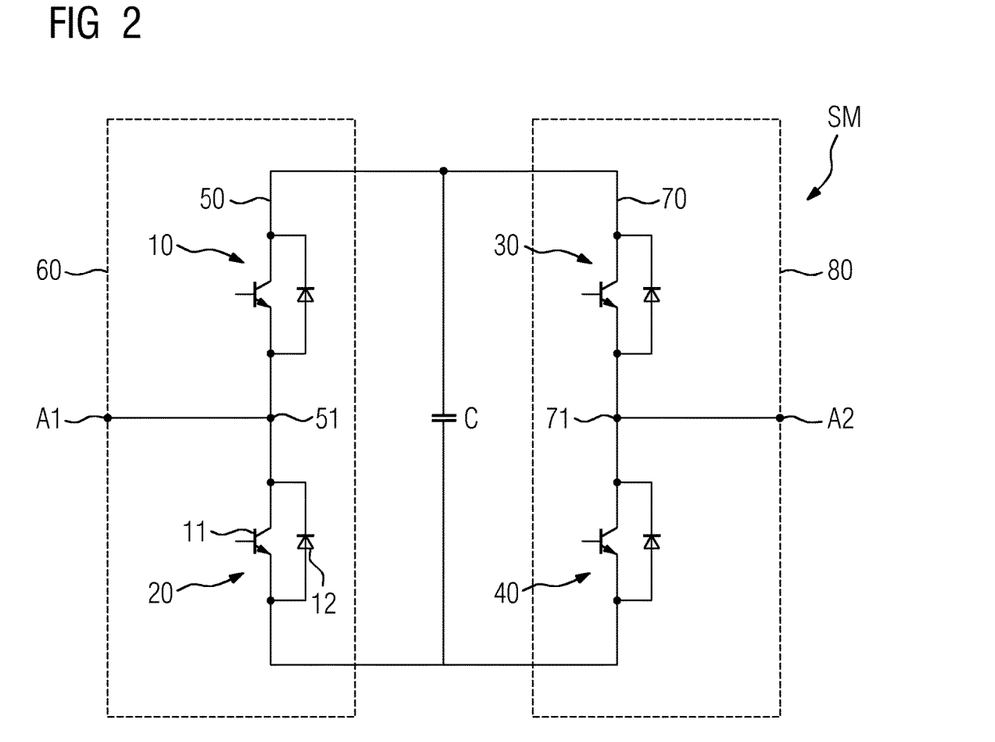
FIG. 2 shows one exemplary embodiment of a submodule which can be used in the multilevel converter in accordance with FIG. 1 or some other multilevel converter and is equipped with two current-carrying heat sinks.

FIG. 2 shows one exemplary embodiment of a submodule SM which can be used in the multilevel converter 5 in accordance with FIG. 1 or some other multilevel converter. The submodule SM has four switches 10, 20, 30 and 40, which can be formed in each case by a switching semiconductor component 11, for example a transistor or the like, and a diode 12 connected in parallel.

The two switches 10 and 20 arranged on the left in FIG. 2 are electrically connected in series and form a series circuit 50, which is arranged on a first heat sink 60 of the submodule SM. The switches 10 and 20 of the series circuit 50 are therefore cooled by the first heat sink 60.

The first heat sink 60 has a further function in the submodule SM, namely the function of a current-carrying module terminal A1 of the submodule SM. For this purpose, a center terminal 51 of the series circuit 50, said center terminal being connected to in each case one of the switch terminals of the two switches 10 and 20, is electrically connected to the first heat sink 60. A contacting of the center terminal 51 of the series circuit 50 or an electrical contacting of the switches 10 and 20 can thus be carried out by electrical contacting of the first heat sink 60.

The two switches 30 and 40 likewise form a series circuit, which is identified by the reference sign 70 in FIG. 2. The series circuit 70 or the two switches 30 and 40 are arranged on a second heat sink 80, which cools the two switches 30 and 40 during the operation of the submodule SM. A further function of the second heat sink 80 consists in forming a current-carrying module terminal A2 of the submodule SM. For this purpose, a center terminal 71 of the series circuit 70 is electrically connected to the heat sink 80.

A capacitor C that is electrically connected in parallel with the two series circuits 50 and 70 is electrically isolated from the two heat sinks 60 and 80.

Figure 3:
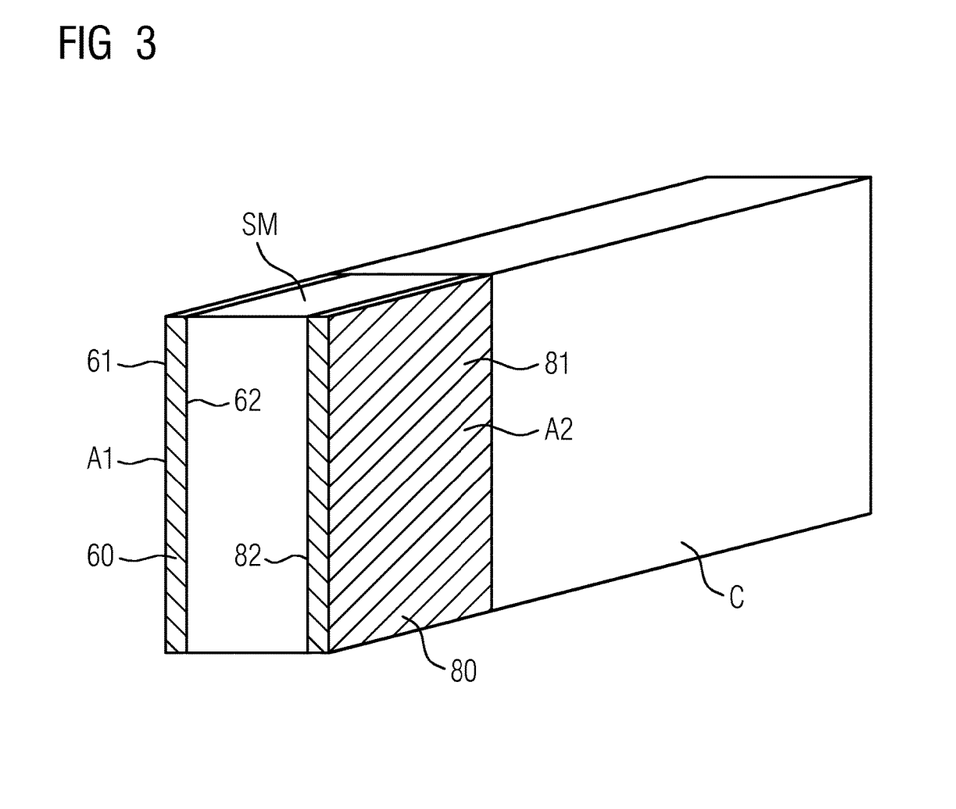
FIG. 3 shows the mechanical construction of the submodule in accordance with FIG. 2 in a three-dimensional view obliquely from the side.

FIG. 3 shows the mechanical construction of the submodule SM in accordance with FIG. 2 in a three-dimensional view obliquely from the side. The two outer heat sinks 60 and 80 can be discerned, which form the current-carrying external module terminals A1 and A2 in the form of module terminal plates. In order to enable a plurality of submodules SM to be placed onto one another, the heat sinks 60 and 80 are preferably planar and parallel on the outer wall side, such that a plurality of submodules SM can be placed onto one another to form a submodule group. The two preferably externally planar outer walls of the two heat sinks 60 and 80, said outer walls preferably being arranged parallel to one another, are identified by the reference signs 61 and 81 in FIG. 3.

The series circuits 50 and 70 comprising the switches 10, 20, 30 and 40 of the submodule SM (cf. FIG. 2) are preferably arranged on the inner sides 62 and 82 of the two heat sinks 60 and 80. In the exemplary embodiment in accordance with FIGS. 2 and 3, the series circuit 50 comprising the switches 10 and 20 is mounted on the inner side 62 of the heat sink 60 and the series circuit 70 comprising the two switches 30 and 40 is mounted on the inner side 82 of the heat sink 80. The capacitor C is situated outside the heat sink region, for example.

With the submodules SM in accordance with FIGS. 2 and 3, submodule groups SG can be formed in a very simple manner by the submodules SM being placed onto one another by their outer heat sinks 60 and 80, respectively. This is shown by way of example in FIG. 4.

Figure 4:
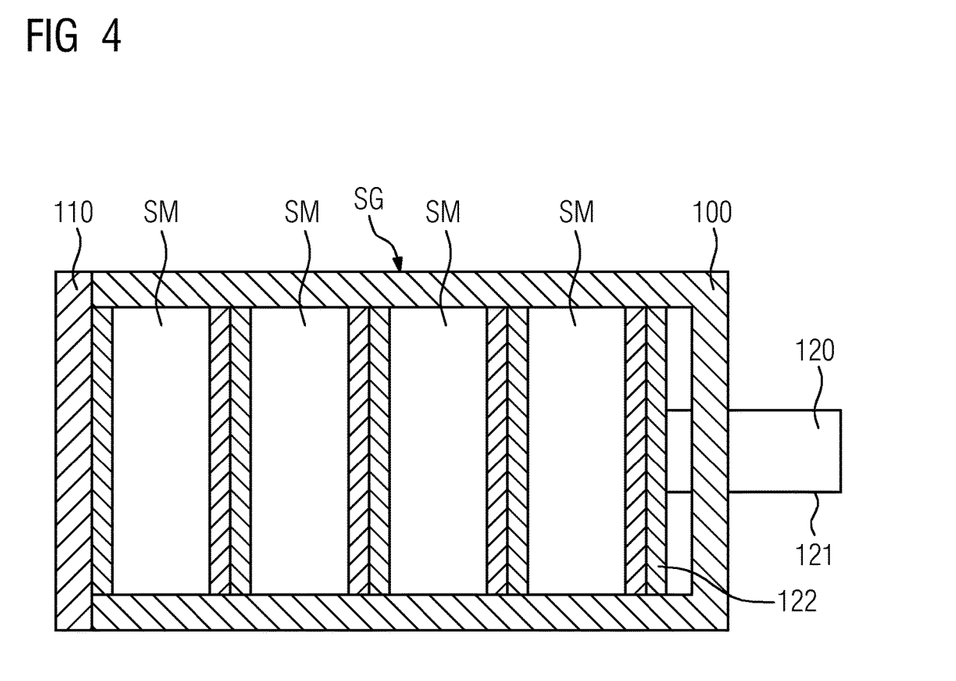
FIG. 4 shows by way of example the formation of a submodule group having the submodules in accordance with FIGS. 2 and 3 in a view from above.

In order to ensure a low-resistance contacting of the submodules SM and to avoid mechanical vibrations on account of the current forces occurring during the operation of the submodules SM, or at least to reduce said vibrations as far as possible, it is regarded as advantageous if the submodules SM of the submodule group SG are pressed onto one another by means of a clamping device 100. The clamping device 100 preferably consists of an electrically nonconductive material in order to avoid a short circuit of the submodules SM. The clamping device 100 can be formed for example by a frame 110 and a ramp 120, for example in the form of a screw 121 and a press plate 122.

Figure 5:
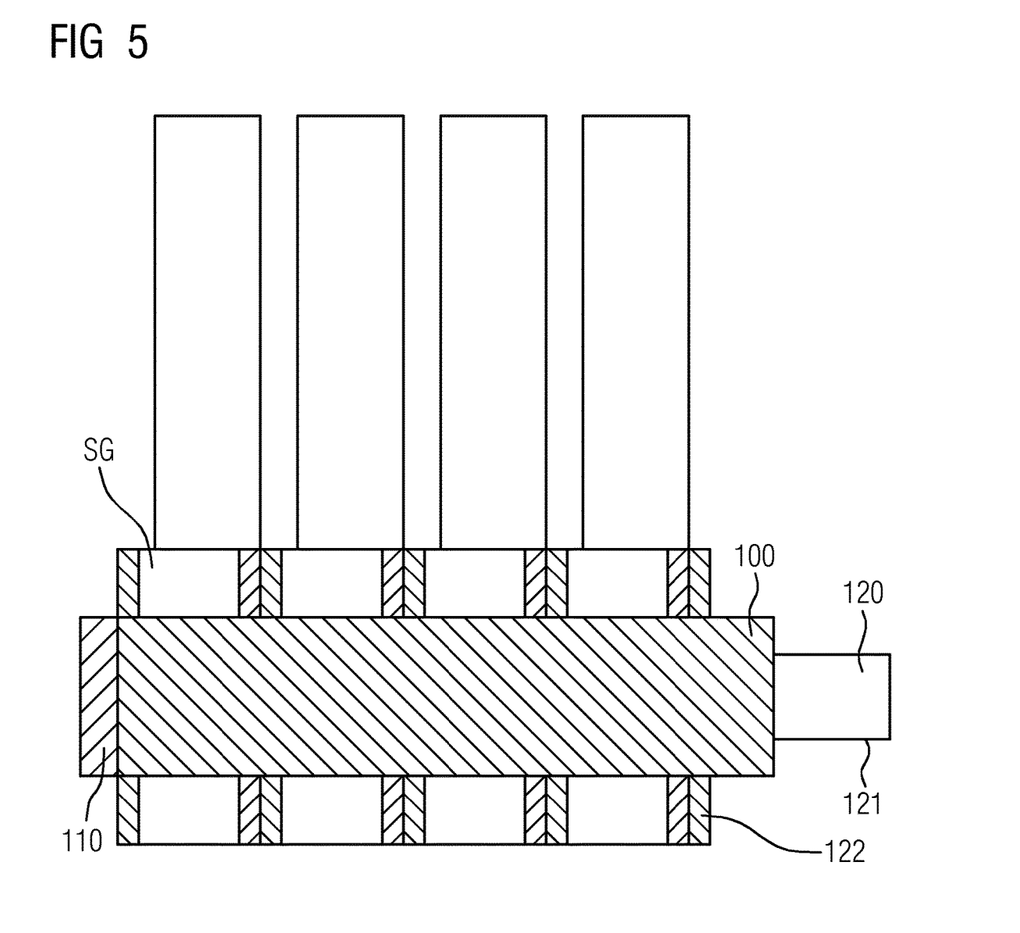
FIG. 5 shows the submodule group in accordance with FIG. 4 in a view from the side.

FIG. 5 shows the submodule group SG with the electrically insulating clamping device 100 once again in a view from the side. It can be discerned that the submodules SM of the submodule group SG are fixedly pressed onto one another by the clamping device 100.

Figure 6:
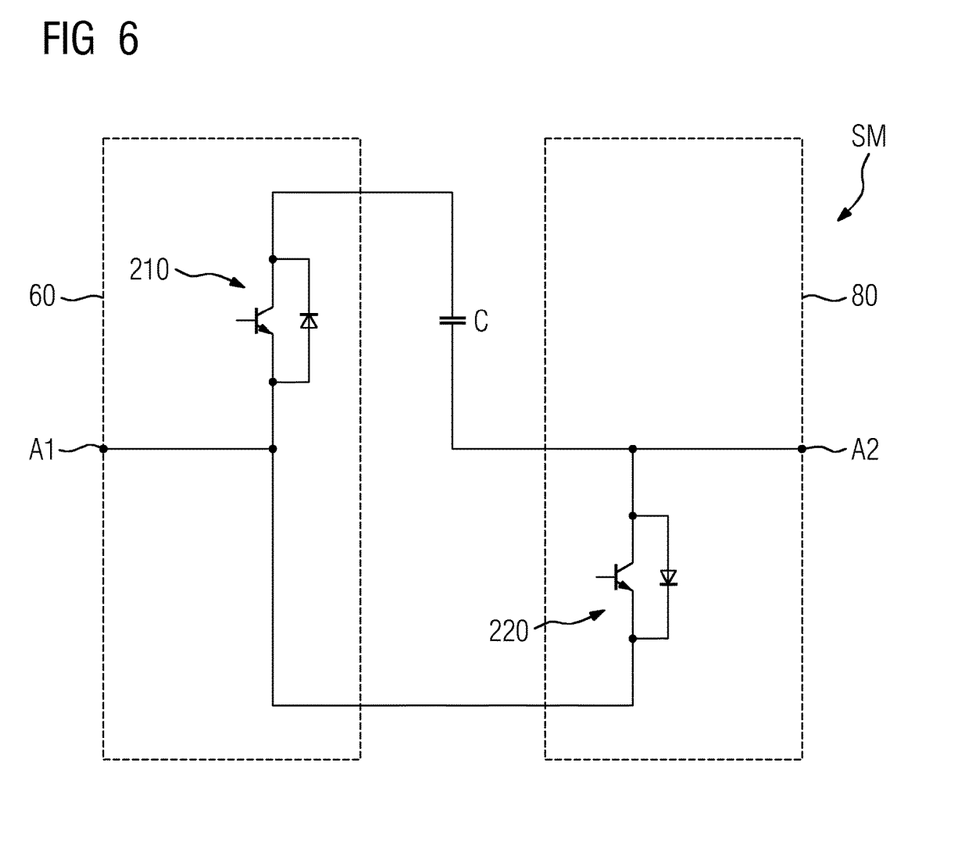
FIG. 6 shows a further exemplary embodiment of a submodule which can be used in the multilevel converter in accordance with FIG. 1 or some other multilevel converter and has two current-carrying heat sinks.

FIG. 6 shows a further exemplary embodiment of a submodule SM which can be used in the multilevel converter 5 in accordance with FIG. 1 or some other multilevel converter. The submodule SM has two switches 210 and 220, which are respectively fixed to a heat sink 60 and 80 of the submodule SM. The two heat sinks 60 and 80 furthermore perform the function of current-carrying module terminals A1 and A2 of the submodule SM. For this purpose, in each case one of the switch terminals of the two switches 210 and 220 is connected to the respective heat sink 60 and 80 on which the respective switch is fixed.

With the submodule SM in accordance with FIG. 6, a submodule group SG can be formed by the heat sinks 60 and 80 being placed onto one another, as has been explained by way of example in association with FIGS. 4 and 5. The above explanations in association with FIGS. 4 and 5 are therefore correspondingly applicable to the submodule SM.

Figure 7:
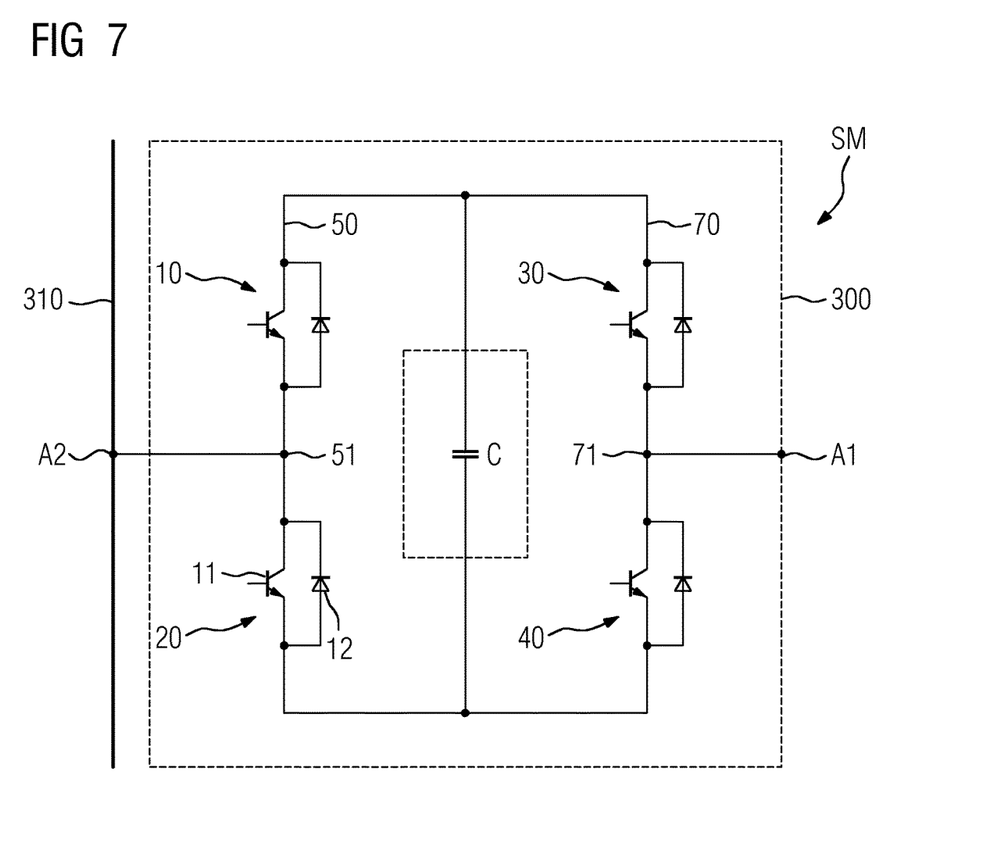
FIG. 7 shows one exemplary embodiment of a submodule which can be used in the multilevel converter in accordance with FIG. 1 or some other multilevel converter and in which one current-carrying external module terminal is formed by a heat sink of the submodule and the other current-carrying external module terminal is formed by an electrode plate.

FIG. 7 shows one exemplary embodiment of a submodule SM which is equipped with four switches 10, 20, 30 and 40 and a capacitor C. The two switches 10 and 20 are electrically connected in series and form a series circuit 50. The two switches 30 and 40 are likewise electrically connected in series and form a series circuit 70.

In contrast to the exemplary embodiment in accordance with FIGS. 2 and 3, in the exemplary embodiment in accordance with FIG. 7, only a single heat sink 300 is provided, which serves for cooling all four switches 10, 20, 30 and 40. A center terminal 71 of the series circuit 70 is electrically connected to the heat sink 300, which on account of said terminal forms one current-carrying module terminal A1 of the submodule SM. The other current-carrying module terminal A2 of the submodule SM is formed by an electrode plate 310 that is connected to the center terminal 51 of the series circuit 50.

Figure 8:
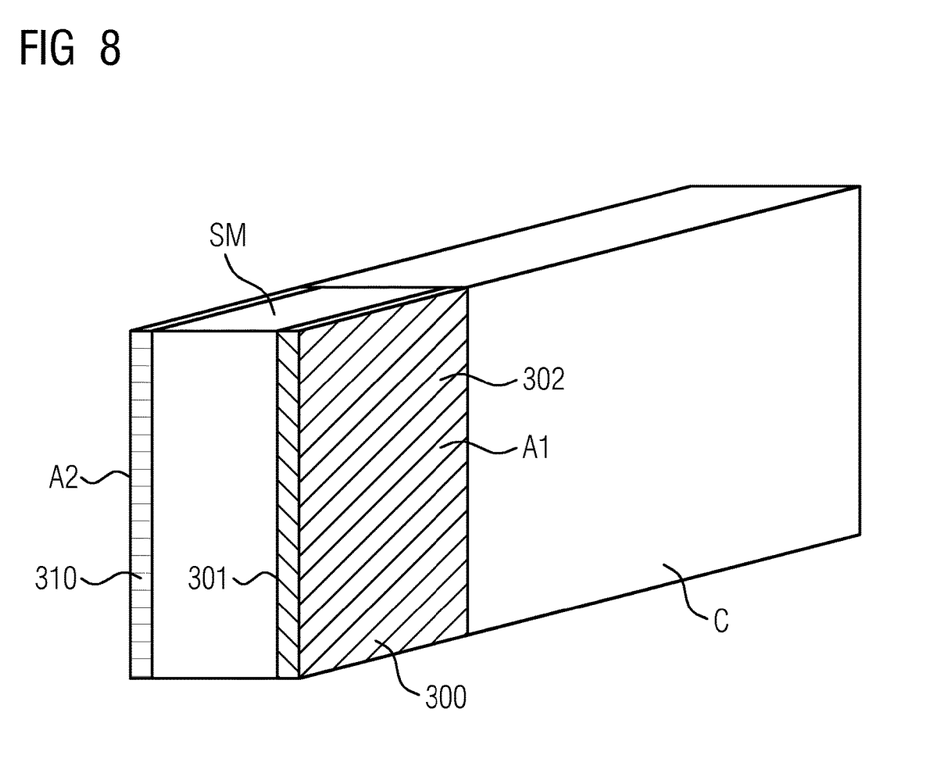
FIG. 8 shows the mechanical construction of the submodule in accordance with FIG. 7 in a three-dimensional view obliquely from the side.

FIG. 8 shows the mechanical construction of the submodule SM in accordance with FIG. 7 in a three-dimensional view obliquely from the side. The heat sink 300 can be discerned, on the inner side 301 of which the switches 10, 20, 30 and 40 are mounted. The outer wall 302 of the heat sink 300 forms the current-carrying module terminal A1 of the submodule SM.

Furthermore, the electrode plate 310 can be discerned in FIG. 8, said electrode plate being electrically connected to the center terminal 51 of the series circuit 50. It can be discerned that the electrode plate 310 is configured in a planar fashion and is arranged parallel to the outer wall 302 of the heat sink 300. On account of the planar configuration of the outer wall 302 of the heat sink 300 and the planar configuration of the electrode plate 310, it is possible to connect the submodule SM in series with submodules of identical type by these submodules being arranged alongside one another in a cascaded manner and being pressed onto one another.

Figure 9:
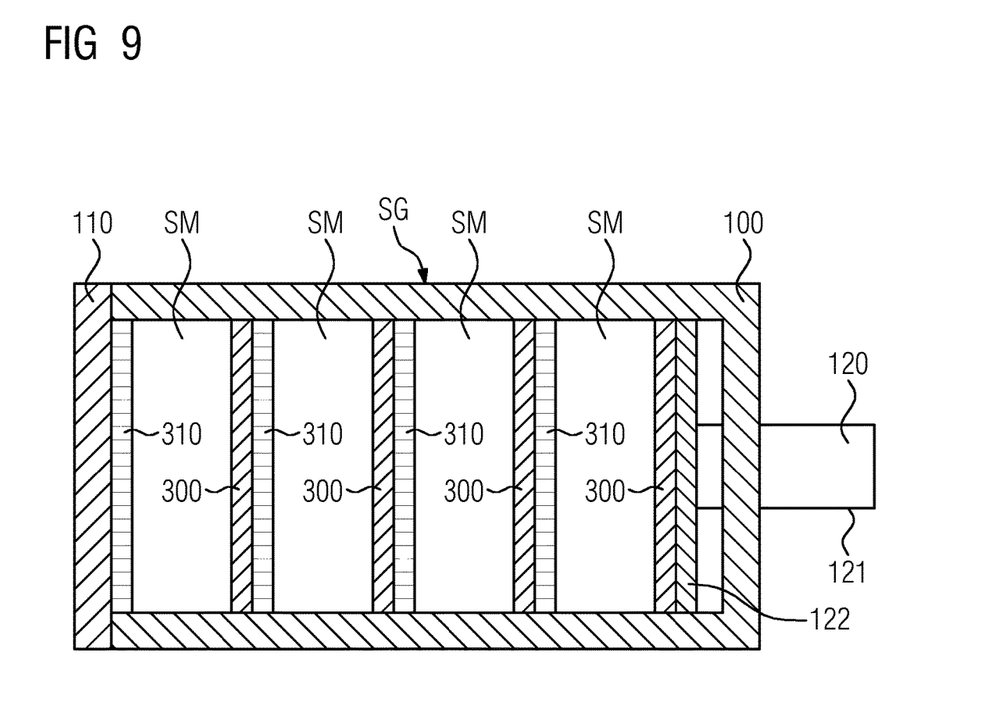
FIG. 9 shows the formation of a submodule group having the submodules in accordance with FIGS. 7 and 8 in a view from above.

FIG. 9 shows by way of example the formation of a submodule group SG by submodules SM in accordance with FIGS. 7 and 8 being pressed onto one another. It can be discerned that the submodules SM are placed onto one another in such a way that the electrode plate 310 of each inner submodule SM bears in each case against the heat sink 300 of one adjacent submodule SM and the heat sink 300 of each inner submodule SM bears against the electrode plate 310 of another adjacent submodule SM.

In order to avoid mechanical vibrations on account of the current forces occurring during the operation of the submodule SM or to reduce said vibrations to the greatest possible extent, the submodules SM are preferably pressed together by means of a clamping device 100 consisting of an electrically insulating material, as has already been explained above in association with FIGS. 4 and 5. The clamping device 100 can be formed by a frame 110 and a ramp 120, for example.

Figure 10:
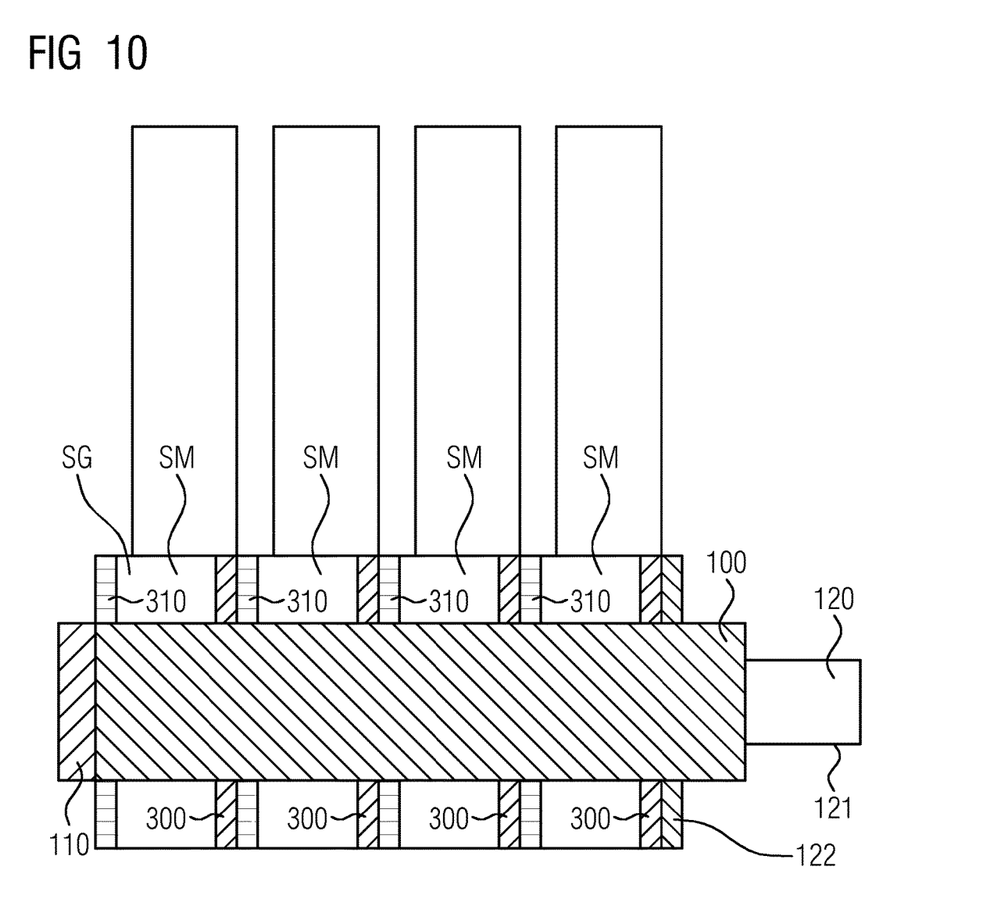
FIG. 10 shows the submodule group in accordance with FIG. 9 in a lateral view.

FIG. 10 shows the formation of the submodule group SG in accordance with FIG. 9 once again in a view from the side. It can be discerned that the submodules SM are placed onto one another in such a way that the electrode plate of each inner submodule bears against a heat sink of one adjacent submodule and the heat sink of each inner submodule bears against an electrode plate of another adjacent submodule.

Figure 11:
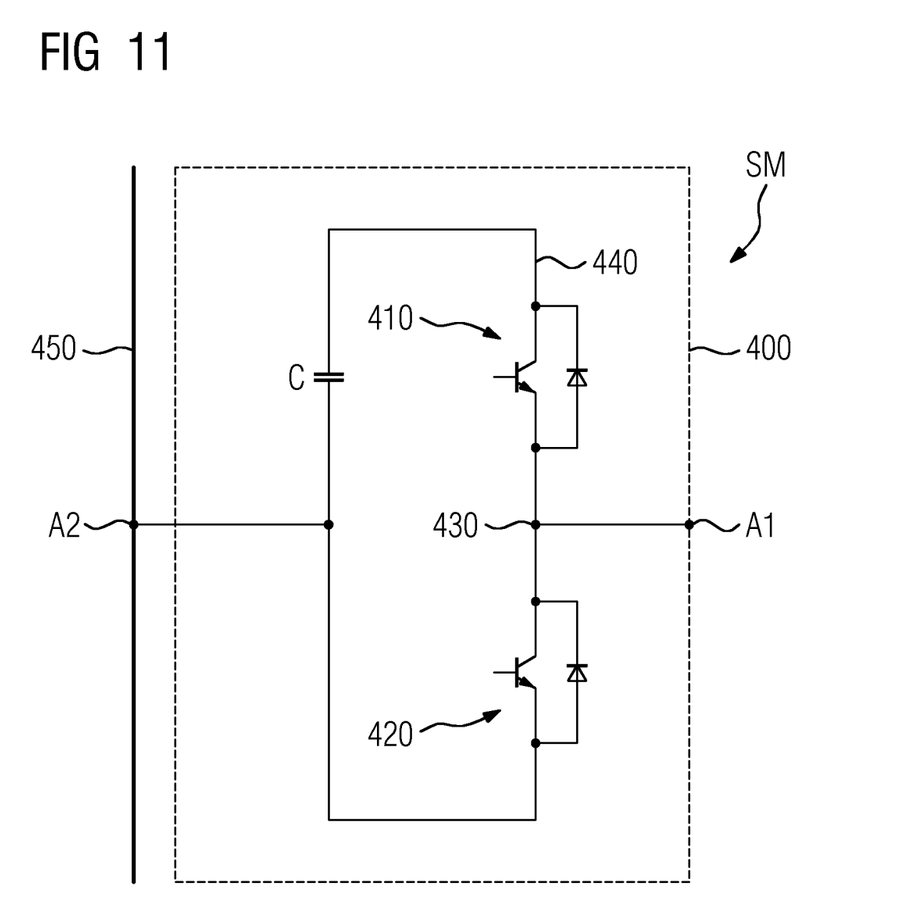
FIG. 11 shows a further exemplary embodiment of a submodule which can be used in the multilevel converter in accordance with FIG. 1 or some other multilevel converter and in which one current-carrying external module terminal is formed by a heat sink of the submodule and another current-carrying external module terminal is formed by an electrode plate.

FIG. 11 shows a further exemplary embodiment of a submodule SM which can be used in the multilevel converter 5 in accordance with FIG. 1 or some other multilevel converter.

The submodule SM has a heat sink 400 suitable for cooling the two switches 410 and 420 of the submodule SM. Furthermore, the heat sink 400 serves as a current-carrying module terminal A1 of the submodule SM. For this purpose, the heat sink 400 is electrically connected to a center terminal 430 of the series circuit 440 formed by the two switches 410 and 420.

A further current-carrying external module terminal A2 of the submodule SM is formed by an electrode plate 450, which is electrically connected to a capacitor C and the switch 420 of the submodule SM.

The mechanical construction of the submodule SM in accordance with FIG. 11 preferably corresponds to the mechanical construction of the submodule SM in accordance with FIG. 8, such that reference should be made to the above explanations, which can be correspondingly applicable here. In this regard, it is possible, for example, to utilize the submodule SM in accordance with FIG. 11 for forming a submodule group SG, as has been explained in association with FIGS. 9 and 10.

Although the invention has been more specifically illustrated and described in detail by means of preferred exemplary embodiments, nevertheless the invention is not restricted by the examples disclosed, and other variations can be derived therefrom by the person skilled in the art, without departing from the scope of protection of the invention.

LIST OF REFERENCE SIGNS

5 Multilevel converter
10 Switch
11 Switching semiconductor component
12 Diode
20 Switch
30 Switch
40 Switch
50 Series circuit
51 Center terminal
60 Heat sink
61 Outer wall
62 Inner side
70 Series circuit
71 Center terminal
80 Heat sink
81 Outer wall
82 Inner side
100 Clamping device
110 Frame
120 Ramp
121 Screw
122 Press plate
210 Switch
220 Switch
300 Heat sink
301 Inner side
302 Outer wall
310 Electrode plate
400 Heat sink
410 Switch
420 Switch
430 Center terminal
440 Series circuit
450 Electrode plate
A1 Module terminal
A2 Module terminal
C Capacitor G5a DC voltage terminal
G5b DC voltage terminal
L Inductance
SG Submodule group
SM Submodule
W5 AC voltage terminal
Z Intermediate terminal

The invention claimed is:

1. A multilevel converter, comprising:
at least two submodules connected in series, each of said submodules having in each case at least two switches, a capacitor and two current-carrying external module terminals, at least one of said submodules having at least one heat sink, being an outer heat sink, serving as one of said current-carrying external module terminals;
at least one of said submodules being a half-bridge module having said switches including a first switch and a second switch, said capacitor, said two current-carrying external module terminals with said heat sink;
said second switch is electrically connected in series with said capacitor of said half-bridge module defining a series circuit, said first switch connected in parallel with said series circuit; and
said first switch having two switch terminals, one of said two switch terminals is connected to said heat sink of said half-bridge module and forming one of said two current-carrying external module terminals of said half-bridge module.

2. The multilevel converter according to claim 1, wherein:
said heat sink forms an outer wall of said one submodule;
said heat sink has an inner side and on said inner side at least one of said switches is mounted for cooling purposes; and
said one switch has a switch terminal electrically connected to said heat sink.

3. The multilevel converter according to claim 1, wherein:
at least two adjacent ones of said submodules have in each case said heat sink which forms one of said current-carrying external module terminals of a respective submodule and on said heat sink at least one of said switches of said respective submodule is mounted on an inner wall side of said heat sink for cooling purposes; and
said heat sinks of said at least two adjacent submodules bear against one another on an outer wall side in such a way that said heat sinks form said current-carrying external module terminals and are electrically connected to one another.

4. The multilevel converter according to claim 1, wherein:
at least two of said submodules have in each case said heat sink containing a first heat sink and a second heat sink, said first heat sink serves as a first of said current-carrying external module terminals and said second heat sink serves as a second of said current-carrying external module terminals of a respective submodule; and
said first current-carrying external module terminal of one of said at least two submodules is electrically connected to said second current-carrying external module terminal of another of said at least two submodules, specifically by mechanical contact between said first heat sink of said one of said at least two submodules and said second heat sink of another of said at least two submodules.

5. The multilevel converter according to claim 1, wherein:
at least one of said submodules has a first series circuit, a second series circuit and said capacitor connected in parallel with said first and second series circuits, said first series circuit and said second series circuit contain in each case two of said switches electrically connected in series;
said submodules each have said heat sink including a first heat sink and a second heat sink, said first series circuit is fitted to said first heat sink and said second series circuit is fitted to said second heat sink;
said first series circuit has a center terminal electrically connected to said first heat sink and forms a first of said current-carrying external module terminals of a respective submodule; and
said second series circuit has a center terminal electrically connected to said second heat sink and forms a second of said current-carrying external module terminals of said respective submodule.

6. The multilevel converter according to claim 5, wherein:
at least two of said submodules have in each case a first series circuit and a second series circuit having in each case two of said switches connected in series and in each case said capacitor connected in parallel with said first and second series circuits;
said submodules each have said heat sink including a first heat sink fitted to said first series circuit of a respective submodule and a second heat sink fitted to said second series circuit of said respective submodule;
said first series circuit has a center terminal electrically connected to said first heat sink of said respective submodule and forms a first of said current-carrying external module terminals of said respective submodule;
said second series circuit has a center connection electrically connected to said second heat sink of said respective submodule and forms a second of said current-carrying external module terminals of said respective submodule; and
said submodules bear against one another in pairs in such a way that said first heat sink of one of said submodules bears against said second heat sink of an adjacent one of said submodules and is thermally and electrically conductively connected thereto.

7. The multilevel converter according to claim 1,
at least one of said submodules has at least two half-bridge modules having said switches including a first switch and a second switch and first and second heat sinks;
said first switch of said at least two half-bridge modules is connected to said first heat sink of a respective half-bridge module and said second switch of said at least two half-bridge modules is connected to said second heat sink of said respective half-bridge module;
said first switch has two switch terminals, one of said two switch terminals of said first switch of said at least two half-bridge modules is electrically connected to said first heat sink of said respective half-bridge module and forms a first of said current-carrying external module terminals of said respective half-bridge module;
another of said two switch terminals of said first switch of said at least two half-bridge modules is electrically connected to said second heat sink of said respective half-bridge module and forms a second of said current-carrying external module terminals of said respective half-bridge module; and
said at least two half-bridge modules bear against one another in pairs in such a way that said first heat sink of one of said at least two half-bridge modules bears against said second heat sink of another of said at least two half-bridge modules and is electrically connected thereto.

8. The multilevel converter according to claim 1, wherein:
said submodules include first and second heat sinks, said first and second heat sinks of at least two of said submodules are disposed parallel to one another and form said current-carrying external module terminals; and
at least two of said switches of a respective submodule lie spatially in a region between two of said current-carrying external module terminals of said respective submodule.

9. The multilevel converter according to claim 1,
wherein said submodules includes first and second heat sinks; and
further comprising a clamping device, said clamping device presses said first heat sink of at least one of said submodules onto said second heat sink of an adjacent one of said submodules.

10. The multilevel converter according to claim 1, wherein:
at least one of said submodules has said heat sink on which said switches of a respective switching module are mounted, and said heat sink forms a first of said current-carrying external module terminals of said submodule; and
said one submodule has an electrode plate that is disposed at a distance from said heat sink of said one submodule and forms a second of said current-carrying external module terminals of said one submodule.

11. The multilevel converter according claim 10, wherein:
at least two of said submodules have in each case said heat sink on which said switches of a respective switching module are mounted, and said heat sink forms a first of said current-carrying external module terminals of a respective submodule;
said at least two submodules have in each case an electrode plate that is disposed at a distance from said heat sink of said respective submodule and forms a second of said current-carrying external module terminals of said respective submodule; and
said first current-carrying external module terminal of one of said at least two submodules is electrically connected to said second current-carrying external module terminal of another of said at least two submodules, specifically by a mechanical contact between said heat sink of said one of said at least two submodules and said electrode plate of another of said at least two submodules.

12. The multilevel converter according to claim 11, wherein:
said heat sink and said electrode plate in said at least two submodules are disposed in each case parallel to one another and form said current-carrying external module terminals of said respective submodule; and
at least two of said switches of each of said at least two submodules in each case lie spatially in a region between said two current-carrying external module terminals.

13. The multilevel converter according to claim 11, further comprising a clamping device for pressing said heat sink of at least one of said submodules onto said electrode plate of an adjacent one of said submodules.

* * * * *